(12) United States Patent
Guo et al.

(10) Patent No.: US 10,339,448 B2
(45) Date of Patent: Jul. 2, 2019

(54) METHODS AND DEVICES FOR REDUCING DEVICE TEST TIME

(71) Applicant: Seagate Technology LLC, Cupertino, CA (US)

(72) Inventors: ChengYi Guo, Singapore (SG); TeckKhoon Lim, Singapore (SG); TeckHoon Chua, Singapore (SG)

(73) Assignee: Seagate Technology LLC, Cupertino, CA (US)

(*) Notice: Subject to any disclaimer, the term of this patent is extended or adjusted under 35 U.S.C. 154(b) by 69 days.

(21) Appl. No.: 15/401,409

(22) Filed: Jan. 9, 2017

(65) Prior Publication Data

US 2018/0197574 A1 Jul. 12, 2018

(51) Int. Cl.
*G11B 19/04* (2006.01)
*G06N 3/08* (2006.01)
*G01R 33/12* (2006.01)
*G06F 11/00* (2006.01)
*G06N 3/04* (2006.01)

(52) U.S. Cl.
CPC ........... *G06N 3/08* (2013.01); *G01R 33/1207* (2013.01); *G06F 11/00* (2013.01); *G06N 3/0445* (2013.01); *G11B 19/048* (2013.01)

(58) Field of Classification Search
None
See application file for complete search history.

(56) References Cited

U.S. PATENT DOCUMENTS 6,574,754 B1  6/2003  Smith
8,316,263 B1  11/2012  Gough et al.
8,521,670 B2  8/2013  Paguio

*Primary Examiner* — Brian M Butcher
(74) *Attorney, Agent, or Firm* — Faegre Baker Daniels LLP

(57) ABSTRACT

A method includes receiving a first set of testing data associated with a first group of electronic devices. The first set of testing data is generated during a tuning test applying a first range of testing parameters. The method further includes receiving a second set of testing data associated with the first group of electronic devices. Further, the method includes determining, based on the first set of testing data and the second set of testing data, a second range of testing parameters that is less than the first range of testing parameters. The method includes testing a second group of electronic devices using a tuning test applying the second range of testing parameters.

20 Claims, 6 Drawing Sheets

METHODS AND DEVICES FOR REDUCING DEVICE TEST TIME

SUMMARY

In certain embodiments, a method includes receiving a first set of testing data associated with a first group of electronic devices. The first set of testing data is generated during a tuning test applying a first range of testing parameters. The method further includes receiving a second set of testing data associated with the first group of electronic devices. Further, the method includes determining, based on the first set of testing data and the second set of testing data, a second range of testing parameters that is less than the first range of testing parameters. The method includes testing a second group of electronic devices using a tuning test applying the second range of testing parameters.

In certain embodiments, a method includes receiving a first set of testing data, wherein the first set of testing data is associated with a first group of electronic devices and is generated during a screening test. The method further includes receiving a second set of testing data. The second set of testing data is associated with the first group of electronic devices and comprises data from predetermined categories of data. Further, the method includes receiving a third set of testing data, wherein the third set of testing data is associated with a second group of electronic devices and comprises data from the predetermined categories of data. The method includes predicting whether an electronic device from the second group of electronic devices passes or fails the screening test in response to the first, second, and third sets of testing data.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

Figure 1:
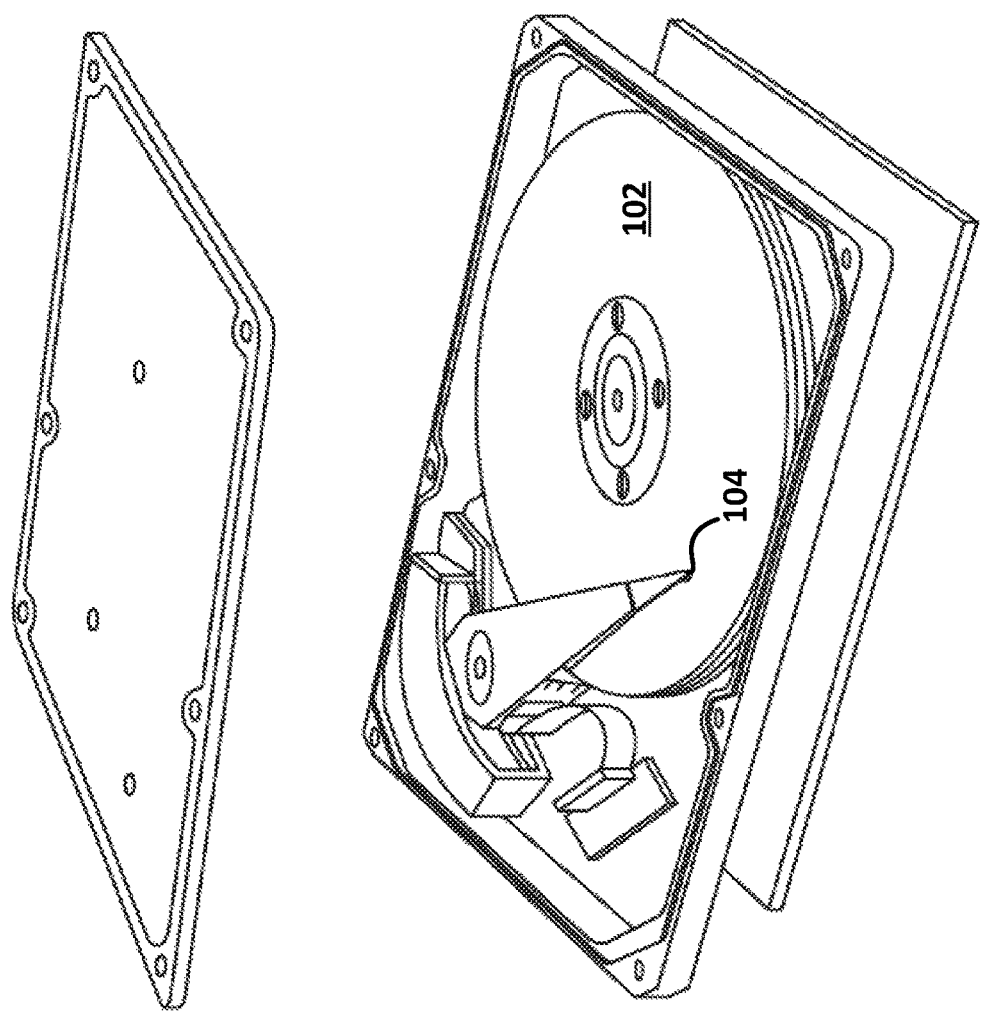
FIG. 1 shows an exploded, perspective view of a hard drive.

While the disclosure is amenable to various modifications and alternative forms, specific embodiments have been shown by way of example in the drawings and are described in detail below. The intention, however, is not to limit the disclosure to the particular embodiments described but instead is intended to cover all modifications, equivalents, and alternatives falling within the scope the appended claims.

DETAILED DESCRIPTION

To meet the demand for digital storage and compete with other storage technologies, hard disc drives (such as hard disc drive 100 in FIG. 1) continue to increase in areal density. Increased areal density typically involves—among other things—increasing the number of tracks (which reduces the size of the tracks to allow for more tracks in a given area) on a hard disc drive's magnetic recording media 102 and/or incorporating new, more complex recording technologies such as shingled magnetic recording (SMR) and heat-assisted magnetic recording (HAMR). Decreased track sizes lead to smaller error tolerances, and new recording technologies lead to subjecting hard disc drives to additional tests during manufacture. As a result, time and cost for manufacturing hard disc drives 100 continues to increase as the time required to test hard disc drives 100 increases.

Certain embodiments of the present disclosure are accordingly directed to methods and devices for reducing time required to test hard disc drives. More particularly, certain embodiments of the present disclosure involve utilizing statistical analysis—including various artificial neural network approaches—to reduce test time. Although the present disclosure uses hard disc drives as an example, the disclosed approaches may be useful for reducing test time of other types of devices (e.g., electronic devices) and components of the various types of devices.

In certain embodiments, the present disclosure contemplates using statistical analysis, such as artificial neural network approaches, to predict which hard disc drives require certain testing. This analysis saves test time and increases a factory's throughput by reducing the number of hard disc drives that are subjected to certain tests. For example, during manufacture, hard disc drives are subjected to a wide variety of tests, some of which are pass/fail tests (e.g., screening tests). Under a pass/fail test, a hard disc drive must meet certain minimum criteria to continue to the next stage of manufacturing. If the hard disc drive fails such a test, the hard disc drive will be "re-worked" (e.g., where failing components are swapped with new components) or scrapped. However, as will be explained in more detail below, the inventors of the present disclosure have found that not all hard disc drives need to be subjected to each pass/fail test.

In certain embodiments, the present disclosure also contemplates using statistical analysis, such as artificial neural network approaches, to identify smaller ranges of testing parameters. This analysis saves test time and increases a factory's throughput by subjecting hard disc drives to fewer testing parameters. For example, during manufacture, hard disc drives are subjected to tests (e.g., tuning tests) during which certain hard disc drive operational parameters are set. However, as will be explained in more detail below, the inventors of the present disclosure have found that not all potential ranges of parameters need to be tested for each hard disc drive.

As mentioned above, hard disc drives are subjected to a wide variety of tests during manufacture. During the various tests, data about individual hard disc drives and their performance are gathered, stored, and analyzed, etc. The inventors of the present disclosure have found that certain data can be used as inputs to statistical analysis, such as artificial neural network approaches, to reduce test time for subsequent tests. It is appreciated that artificial neural networks can be implemented in a variety of approaches, including a multilayer feedforward network approach (as described below), recurrent neural network approach, among other approaches.

Artificial neural networks are computational models theoretically based on structures and functions of biological neural networks. One artificial neural network approach involves identifying various inputs and target outputs for training an artificial neural network. For example, a set of "training data"—with known inputs and known outputs—is used to train the artificial neural network. The training data can be data samples for multiple types or categories of data and corresponding known target results for each data sample. The known inputs and outputs can be inputted into the artificial neural network, which processes the data to train itself to resolve/compute results for inputs with unknown results. New inputs can then be provided to the trained artificial neural network 200, which will produce target outputs. As such, a trained artificial neural network can use inputs, which individually may not be a direct input to a test or testing scheme and which may include different classes of parameters/data, to produce desired target outputs.

Figure 2:
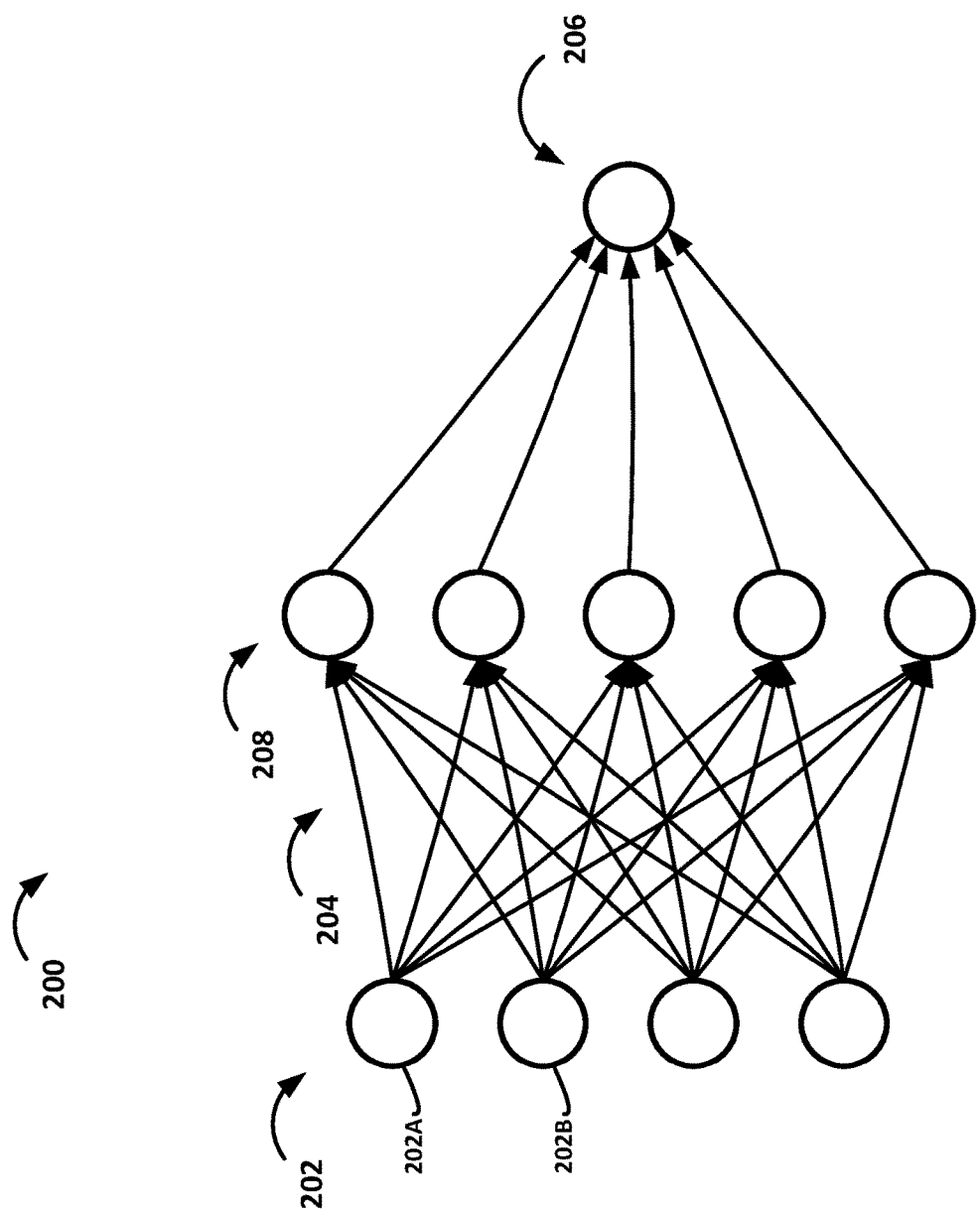
FIG. 2 represents features of a neural network, in accordance with certain embodiments of the present disclosure.

A visualization of an artificial neural network 200 is shown in FIG. 2. The network 200 includes a number of nodes (sometimes referred to as neurons) 202 and connections 204, each of which run between a source node 202A, 202B and a target node 206 in a single direction. Each node 202 represents a mathematical function (e.g., summation, division) of the one or more input to the node 202. An adaptive weight is associated with each connection 204 between the nodes 202. The adaptive weight is a coefficient that is applied to a value of the source node (e.g., 202A) to produce an input to the target node 206. The value of the target node is therefore some function of the source node inputs 202A, 202B, etc., multiplied by their respective weighting factors. For example, a target node 206 may be some function involving a first node 202A multiplied by a first weighting factor, a second node 202B multiplied by a second weighting factor, and so on. FIG. 2 also shows a number of hidden nodes 208, which will be explained in more detail below.

To compute weighting factors associated with each connection 204 of the artificial neural network 200, the weighting factors are first set to random values. Input nodes 202A, 202B, etc.—which represent types or classes of input data— and a target node 206 are chosen to create node pairs. Next, activations are propagated from the input nodes 202A, 202B to hidden nodes 208 for each input node 202, and then activations are propagated from the hidden nodes 208 to target nodes 206 for each hidden node 208. Error is then computed for target nodes 206 by comparing the pattern to actual. Next, error is computed for hidden nodes 208. Based on the computed errors, weighting factors from the connections 204 are adjusted between the hidden nodes 208 and target nodes 206. Weighting factors are then adjusted between the input nodes 202 and the hidden nodes 208. To continue to update the weighting factors (and therefore train the artificial neural network 200), the process restarts where activations are propagated from the input nodes 202 to hidden layer nodes 206 for each input node 202. Once little to no error is computed, the process settles on weighting factors such that the artificial neural network 200 is trained. Essentially, the trained artificial neural network 200 learns what inputs should be given more weight when computing the target output.

In certain embodiments, the target output is a determination of whether a hard disc drive should be subjected to certain pass/fail tests. In other words, the artificial neural network 200 approximates or replaces the pass/fail test itself. In certain embodiments, the target output is a determination of a range of parameters to which a hard disc drive should be subjected.

Figure 3:
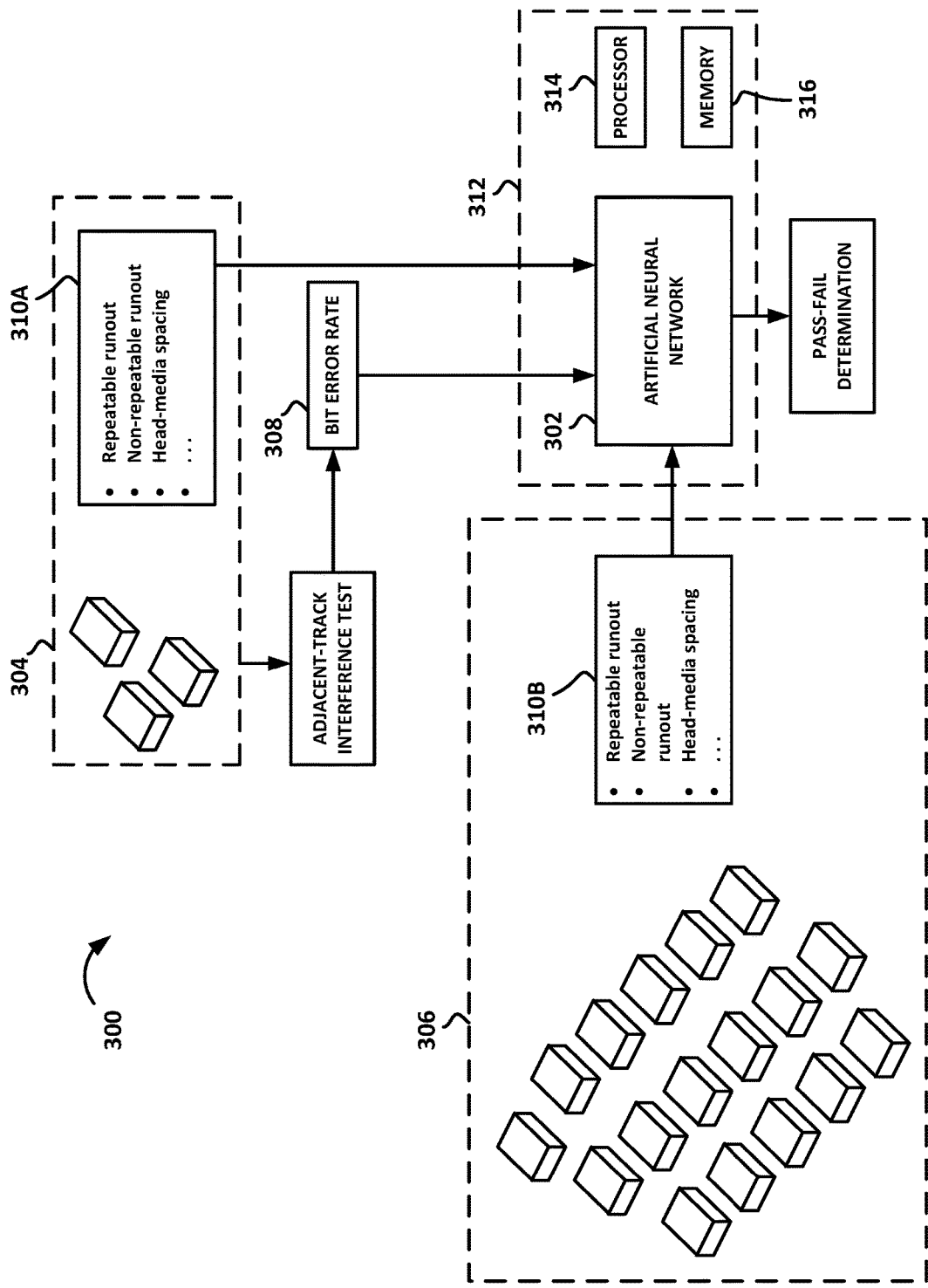
FIG. 3 represents features of a neural network, in accordance with certain embodiments of the present disclosure.
Figure 4:
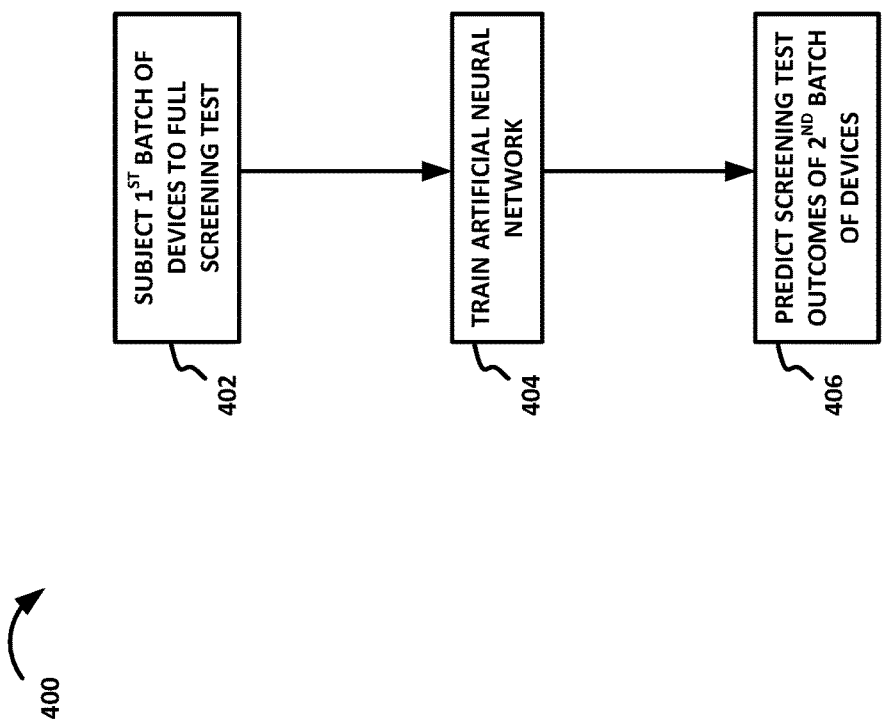
FIG. 4 shows a block representation of steps in a method, in accordance with certain embodiments of the present disclosure.

FIG. 3 shows a system 300 that features an example artificial neural network 302 that can be used in conjunction with pass/fail tests. The artificial neural network 302 can include similar features to the artificial neural network 200 described above. FIG. 3 shows a first batch of hard disc drives 304 that are subjected to a pass/fail test and a second batch of hard disc drives 306 that are not subjected to the pass/fail test. FIG. 4 outlines a set of steps of a method 400 that can be carried out with the artificial neural network 300.

As mentioned above, hard disc drives can be subjected to pass/fail tests (e.g., screening tests) that are used to determine whether hard disc drives meet certain minimum requirements. One example pass/fail test is a test for the occurrence of adjacent-track interference. Adjacent-track interference is undesirable because it involves writing data to an unintended data track, resulting in potential data loss. For example, a hard disc drive's read/write head 104 may write data off-center from a target data track such that data is unintentionally written to tracks adjacent to the target track. Adjacent-track interference can be expressed in terms of a bit-error rate, and the pass/fail criteria can be expressed in terms of a minimum bit-error rate.

The adjacent-track interference test is typically performed near the end of manufacturing a hard disc drive. As such, data about each hard disc drive has been gathered from previous tests. This data can include a width of a hard disc drive's writer (which is part of the read/write head 104), repeatable runout, non-repeatable runout, head-media spacing performance, read-after-write error rate, write power characteristics, writer overwrite capability, track-per-inch margin, bits-per-inch margin, among other types of data gathered during previous tests.

The above-described data can be used as inputs to a trained artificial neural network 302 to predict whether a hard disc drive will pass or fail the adjacent-track interference test. The artificial neural network 302 can be trained based on samples of the above-described data associated with known results. For example, the first batch of hard disc drives 304 can be subjected to an adjacent-track interference test to determine each hard disc drive's bit-error rate (e.g., first set of data 308) (see step 402 in FIG. 4). The artificial neural network 302 can use previous test data (e.g., second set of data 310A) associated with each hard disc drive within the first batch of hard disc drives 304 as known inputs and each hard disc drive's adjacent-track interference test data 308 as a known output (e.g., target) to train the artificial neural network 302 (step 404). The trained artificial neural network 302 can develop a computational model that predicts, based on the above-described data, whether hard disc drives will pass or fail (or will likely pass or fail) the adjacent-track interference test (step 406). For example, the trained artificial neural network 302 can use previous test data (e.g., third set of data 310B) associated with the second batch of hard disc drives 306 to determine, predict, etc., whether hard disc drives in the second batch of hard disc drives 306 will pass or fail the adjacent-track interference test. The second set of data 310A and the third set of data 310B can include the same predetermined categories of data (e.g., width of a hard disc drive's writer, repeatable runout, non-repeatable runout, head-media spacing performance, read-after-write error rate, write power characteristics, writer overwrite capability, track-per-inch margin, bits-per-inch margin). The trained artificial neural network 302 makes such predictions without actually subjecting the second batch of hard disc drives 306 to the adjacent-track interference test.

In certain embodiments, the first batch of hard disc drives 304 is a small percentage of the overall number of hard disc drives manufactured such that only a small percentage of hard disc drives are used to train the artificial neural network 302 and therefore subjected to the adjacent-track interference test. The first batch of hard disc drives 304 subjected to a given pass/fail test for gathering training data should be representative of the second batch hard disc drives 306 that will not be subjected to the pass/fail test. In certain embodiments, data from the first batch of hard disc drives 304 (e.g., the training hard disc drives) are used to predict passage or failure for an entire hard disc drive model. In certain embodiments, data from the first batch of hard disc drives 304 are used to predict passage or failure for a single batch of hard disc drives. In certain embodiments, the artificial neural network 302 is retrained when certain manufacturing processes are changed which may affect how representative the original training data is for hard disc drives manufactured under a different process.

The number of "training" hard disc drives 304 used can vary. In certain embodiments, ten percent or less of a model or batch of hard disc drives is subjected to a pass/fail test to train the artificial neural network 302, while the remaining ninety percent or more of the model or batch of hard disc drives is "tested" through the trained artificial neural network 302. Of course, other percentages (e.g., 20%, 30%, 40%) of models or batches of hard disc drives can be used to train the artificial neural network 302. Using a greater number of hard disc drives to train the artificial neural network 302 may improve reliability of the trained artificial neural network 302 but decrease the test time savings.

In certain embodiments, the artificial neural network 302 is used to completely replace pass/fail tests (e.g., adjacent-track interference tests) such that the artificial neural network 302 itself determines which hard disc drives pass or fail. For example, the artificial neural network 302 could be programmed to identify which hard disc drives will not meet a minimum threshold (e.g., minimum bit-error rate). In certain embodiments, the artificial neural network 302 is used to flag which hard disc drives should be subjected to a pass/fail test. For example, the artificial neural network 302 could be programmed to determine which hard disc drives are more or most likely to fail—a determination which can be confirmed by subjecting such hard disc drives to the actual pass/fail test.

The artificial neural network 302 and its various features and components can be implemented in one or more computing devices 312 (e.g., personal computer, laptop, server) that contain a processor 314 and memory 316. For example, the artificial neural network 302 may be implemented using firmware, integrated circuits, and/or software modules within the one or more computing devices 312 that interact with each other or are combined together. In certain embodiments, the methods disclosed above and outlined in FIG. 4 can be implemented using computer-readable instructions/code that are stored in the memory 316 (or other forms of storage) for execution by the processor 314.

Figure 5:
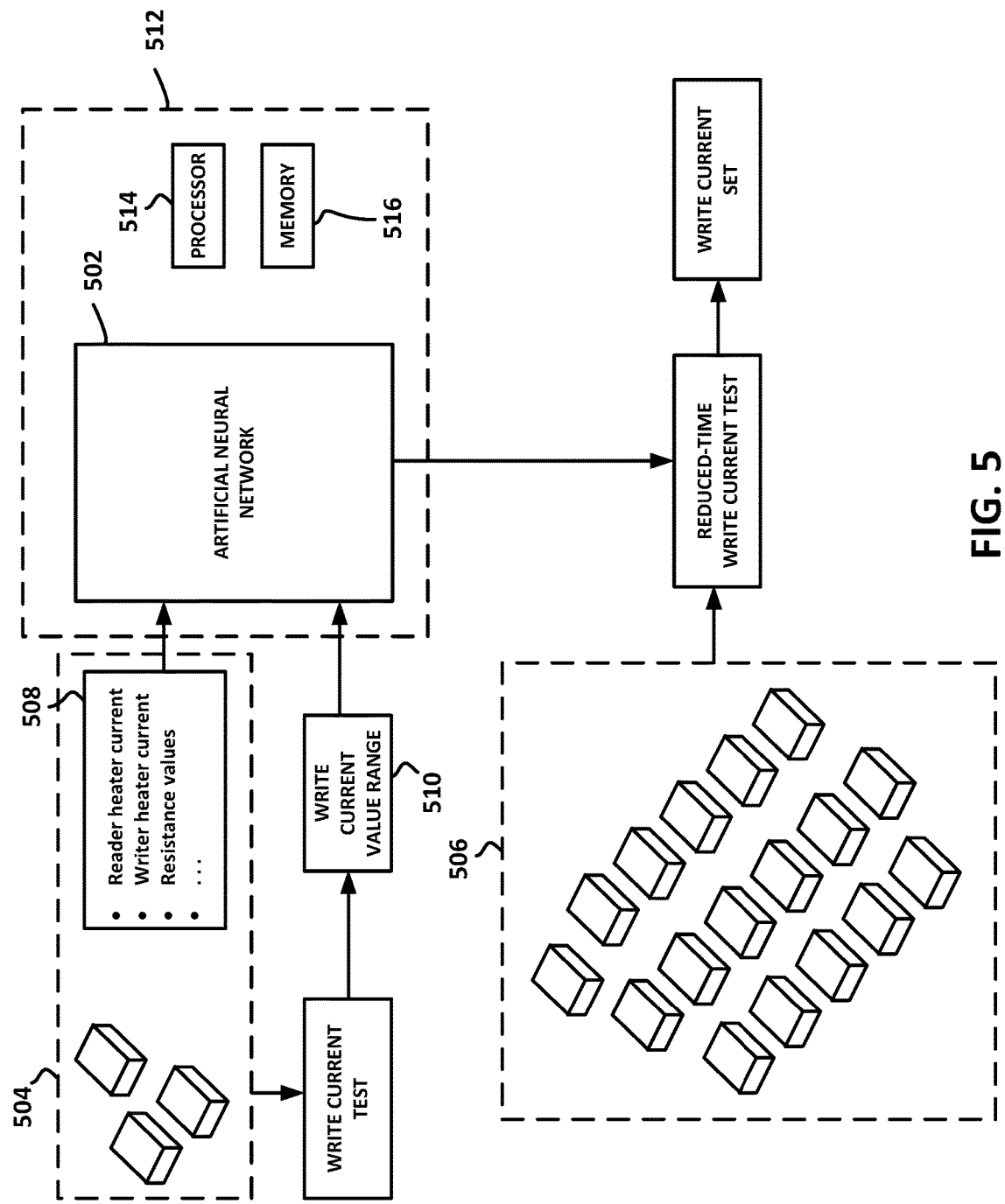
FIG. 5 shows a diagram of a neural network, in accordance with certain embodiments of the present disclosure.
Figure 6:
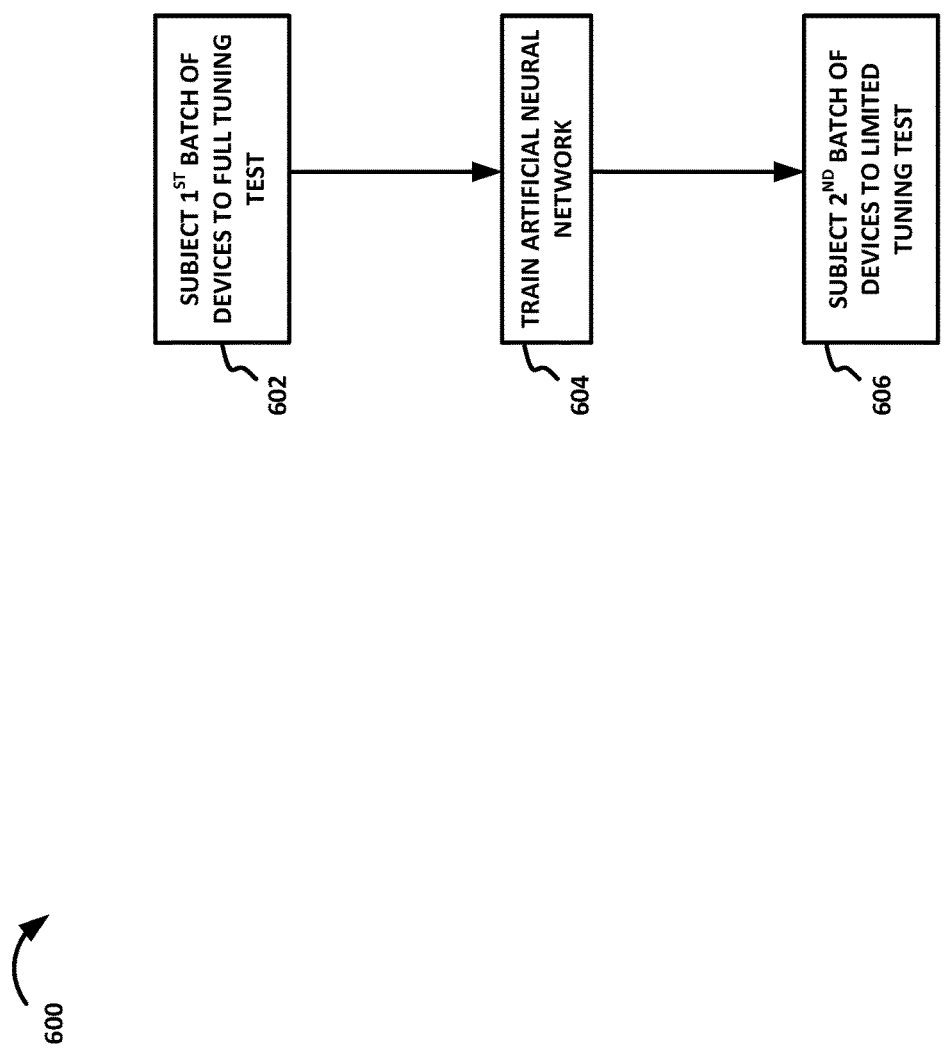
FIG. 6 shows a block representation of steps in a method, in accordance with certain embodiments of the present disclosure.

FIG. 5 shows a system 500 featuring an example artificial neural network 502 that can be used in conjunction with tuning tests. The artificial neural network 502 can include similar features to the artificial neural network 200 described above. FIG. 5 shows a first batch of hard disc drives 504 that are subjected to a full tuning test and a second batch of hard disc drives 506 that are subjected to a limited version of the tuning test. FIG. 6 outlines a set of steps of a method 600 that can be carried out with the artificial neural network 500.

As described above, some tests (e.g., tuning tests) are used to tune certain parameters of a hard disc drive. After such tests, the "tuned" parameters are set such that each hard disc drive will apply such parameters after manufacturing during operation. Examples tuning tests include tests that determine write current values, adjustable fly height parameters, read/write channel parameter optimization, variable bit aspect ratio which is used to determine zones for magnetic recording media, among other tests. The description below uses a write current test as an example tuning test. It is appreciated that the approach described below is applicable to other parameter-determining tests.

The objective of the write current test is to determine an optimal write current value that will produce a read/write head able to write data at a high areal density. If a hard disc drive uses too low of write current, data may not be written consistently or accurately to magnetic recording media. If write current is too high, data may be written to unintended tracks on magnetic recording media through adjacent-track and side-track erasure. Too high of write current may also cause the read/write head to contact the recording media and damage the head and recording media.

During testing, hard disc drives are subjected to a range of write current values. For each write current value, certain parameters are measured such as each hard disc drive's tracks-per-inch capability, bits-per-inch capability, adjacent-track interference characteristics, among others. Based on the measured parameters for each write current value, an optimal write current value is selected to be used in the hard disc drives during operation. Because several parameters are measured for each write current value, the write current test takes more time as the range of tested write current values increases for each hard disc drive.

The write current test is typically performed on hard disc drives after much data has been gathered about the hard disc drives from previous tests. This data can include resistance values from the read/write head's magneto-resistive element; current values used in write/head heaters such as writer pre-heat current, writer heat current, and reader heat current; adaptive fly height current data which determines how much current is applied to a heater on a per head/per zone basis; the minimum cylinder number (e.g., track/zone indicator); eccentricity which is the eccentricity of servo data written to magnetic recording media; a width of a hard disc drive's writer; bias current set for a reader of the read/write head; among other types of data.

The above-described data can be used as inputs to an artificial neural network 500 to determine a set of write current values to test that is smaller than a set of values typically tested. It is appreciated that other tuning tests may utilize other types of data. For example, channel optimization tests may utilize inputs such as bit-error rates and other channel-related parameters.

The artificial neural network 502 can be trained based on samples of the above-described data. For example, the first batch of hard disc drives 504 can be subjected to a write current test to determine each hard disc drive's optimal write current value (e.g., first set of data 508) (step 602 in FIG. 6). The artificial neural network 502 can use previous test data (e.g., second set of data 510) associated with each hard disc drive (e.g., input) and each hard disc drive's write current test data 508 (e.g., target) and compute a model that determines what range of write current values should be tested for to set each hard disc drive's write current values (step 604). The second batch of hard disc drives 506 can then be subjected to the limited write current test (step 606), which will set each hard disc drive's operational write current values.

Here, the artificial neural network 502 works to reduce test time of a test that each hard disc drive is subjected to—rather than eliminate or substantially reduce the test itself like the artificial neural network 302 of FIG. 3. By subjecting the second batch of hard disc drives 506 to a smaller range of parameters, the tuning test takes less time to complete. For example, the artificial neural network 502 may determine that the write current test need only subject each hard disc drive to a range of ten write current values rather than thirty write current values to determine the final write current, thus reducing the overall write current test time for the second batch of hard disc drives 506.

In certain embodiments, the first batch of hard disc drives 504 is a small percentage of the overall number of hard disc drives manufactured such that only a small percentage of hard disc drives are used to train the artificial neural network 502. The first batch of hard disc drives 504 subjected to a given tuning test for gathering training data should be representative of the to-be-tested hard disc drives. In certain embodiments, data from the training drives are used to predict tuning ranges for an entire hard disc drive model. In certain embodiments, data from the training drives are used to predict tuning ranges for a single batch of hard disc drives. In certain embodiments, the artificial neural network 502 is retrained when certain manufacturing processes are changed which may affect how representative the original training data is for hard disc drives manufactured under a different process.

The number of "training" hard disc drives used can vary. In certain embodiments, ten percent or less of a model or batch of hard disc drives is subjected to a full range of tuning parameters to train the artificial neural network 502, while the remaining ninety percent or more of the model or batch of hard disc drives is subjected to a smaller range of tuning parameters determined by the trained artificial neural network 502. Of course, other percentages (e.g., 20%, 30%, 40%) of models or batches of hard disc drives can be used to train the artificial neural network 502. Using a greater number of hard disc drives to train the artificial neural network 502 may improve reliability of the trained artificial neural network 502 but decrease the test time savings.

The artificial neural network 502 and its various features and components can be implemented in one or more computing devices 512 (e.g., personal computer, laptop, server) that contain a processor 514 and memory 516. For example, the artificial neural network 502 may be implemented using firmware, integrated circuits, and/or software modules within the one or more computing devices 512 that interact with each other or are combined together. In certain embodiments, the methods disclosed above can be implemented using computer-readable instructions/code that are stored in the memory 516 (or other forms of storage) for execution by the processor 514.

Various modifications and additions can be made to the embodiments disclosed without departing from the scope of this disclosure. For example, while the embodiments described above refer to particular features, the scope of this disclosure also includes embodiments having different combinations of features and embodiments that do not include all of the described features. Accordingly, the scope of the present disclosure is intended to include all such alternatives, modifications, and variations as falling within the scope of the claims, together with all equivalents thereof.

We claim:

1. A method for testing a group of electronic devices, the method comprising:
receiving a first set of testing data associated with a first group of electronic devices, wherein the first set of testing data is generated during a tuning test applying a first range of testing parameters;
receiving a second set of testing data associated with the first group of electronic devices;
determining, based on the first set of testing data and the second set of testing data, a second range of testing parameters that is less than the first range of testing parameters; and
subjecting a second group of electronic devices through a tuning test applying the second range of testing parameters.

2. The method of claim 1, wherein the second set of testing data is generated prior to the tuning test.

3. The method of claim 1, wherein the first group of electronic devices has fewer electronic devices than the second group of electronic devices.

4. The method of claim 1, wherein the second range of testing parameters is determined using an artificial neural network.

5. The method of claim 4, wherein determining the second range of testing parameters further comprises:
training the artificial neural network by inputting the first set of testing data and the second set of testing data associated with the first group of electronics devices into the artificial neural network; and
using the trained artificial neural network to determine the second range of testing parameters.

6. The method of claim 1, wherein the electronics devices are hard disc drives.

7. The method of claim 6, wherein the tuning test is one of a write current test, adjustable fly height test, channel optimization test, and variable bit aspect ratio test.

8. The method of claim 6, wherein the tuning test is a write current test, and wherein the first range of testing parameters and the second range of testing parameters are write current values.

9. The method of claim 8, wherein the second set of testing data includes at least one of resistance values of magneto-resistive elements, heater current values, cylinder numbers, servo data eccentricity, writer width, and reader bias current.

10. A method comprising:
subjecting a first group of electronic devices through a screening test to generate a first set of testing data associated with the first group of electronic devices;
subjecting the first group of electronic devices through a series of tests separate from the screening test to generate a second set of testing data, wherein the second set of testing data is associated with the first group of electronic devices and comprises data from predetermined categories of data;
subjecting a second group of electronic devices through the series of tests to generate a third set of testing data, wherein the third set of testing data is associated with the second group of electronic devices and comprises data from the predetermined categories of data; and
in response to the first, second, and third sets of testing data, predicting whether an electronic device from the second group of electronic devices passes or fails the screening test.

11. The method of claim 10, wherein the second set of testing data is generated prior to the screening test.

12. The method of claim 10, wherein the first group of electronic devices has fewer devices than the second group of electronic devices.

13. The method of claim 10, wherein predicting whether the electronic device from the second group of electronic devices passes or fails the screening test is performed using an artificial neural network.

14. The method of claim 13, wherein predicting whether the electronic device from the second group of electronic devices passes or fails the screening test further comprises:
   training the artificial neural network by inputting the first set of testing data and the second set of testing data associated with the first group of electronics devices into the artificial neural network; and
   using the trained artificial neural network to predict whether the electronic device from the second group of electronic devices passes or fails the screening test.

15. The method of claim 10, wherein the electronics devices are hard disc drives.

16. The method of claim 15, wherein the screening test is an adjacent-track interference test.

17. The method of claim 16, wherein the first set of testing data comprises bit-error rates.

18. The method of claim 16, wherein the second set of testing data includes at least one of a width of a hard disc drive's writer, repeatable runout, non-repeatable runout, read-after-write error rate, writer overwrite capability, tracks-per-inch margin, and bits-per-inch margin.

19. A method for using an artificial neural network to improve a testing process for electronic devices, the method comprising:
   training an artificial neural network to generate a screening test computational model by:
      inputting to the artificial neural network a first set of testing data generated as a result of subjecting a first group of electronics devices to a series of tests, wherein the first set of testing data comprises data from predetermined categories of data,
      inputting to the artificial neural network a second set of testing data generated as a result of a screening test subjected to the first group of electronic devices, and
      generating the screening test computational model by determining, via the artificial neural network and by processing the first set of testing data and the second set of testing data, a weighting factor for each of the predetermined categories of data,
      wherein the screening test computational model comprises the determined weighting factors;
   subjecting a third set of testing data to the screening test computational model, the third set of testing data generated as a result of a series of tests subjected to a second group of electronic devices, wherein the third set of testing data comprises data from the predetermined categories of data associated with the second group of electronic devices; and
   predicting whether electronic devices from the second group of electronic devices pass or fail the screening test, in response to subjecting the third set of testing data to the screening test computational model.

20. The method of claim 19, wherein the screening test computational model is generated by recursively computing errors between the second set of testing data and a current prediction.

* * * * *